United States Patent [19]

Singh

[11] Patent Number: 4,574,256

[45] Date of Patent: Mar. 4, 1986

[54] VARACTOR TUNED MICROSTRIP OSCILLATOR FOR KA BAND OPERATION

[75] Inventor: Donald R. Singh, Minneapolis, Minn.

[73] Assignee: Honeywell Inc., Minneapolis, Minn.

[21] Appl. No.: 688,125

[22] Filed: Dec. 31, 1984

[51] Int. Cl.[4] .............................................. H03B 5/08
[52] U.S. Cl. ............................ 331/107 SL; 331/177 V
[58] Field of Search ......... 331/107 G, 107 SL, 177 V

[56] References Cited

U.S. PATENT DOCUMENTS 4,521,747  6/1985  Tahim et al. .................. 331/107 SL Primary Examiner—Eugene LaRoche
Assistant Examiner—G. Wan
Attorney, Agent, or Firm—Roger W. Jensen

[57] ABSTRACT

A planar varactor tuned microstrip oscillator for Ka band operation comprising a GaAs Gunn diode, a varactor diode, an impedance inverter microstrip line placing the varactor in shunt with the Gunn diode, an impedance matching transformer connected from the output of the Gunn diode to a load connection means, a source of negative bias potential for the varactor and a source of positive bias potential for the Gunn diode.

3 Claims, 1 Drawing Figure

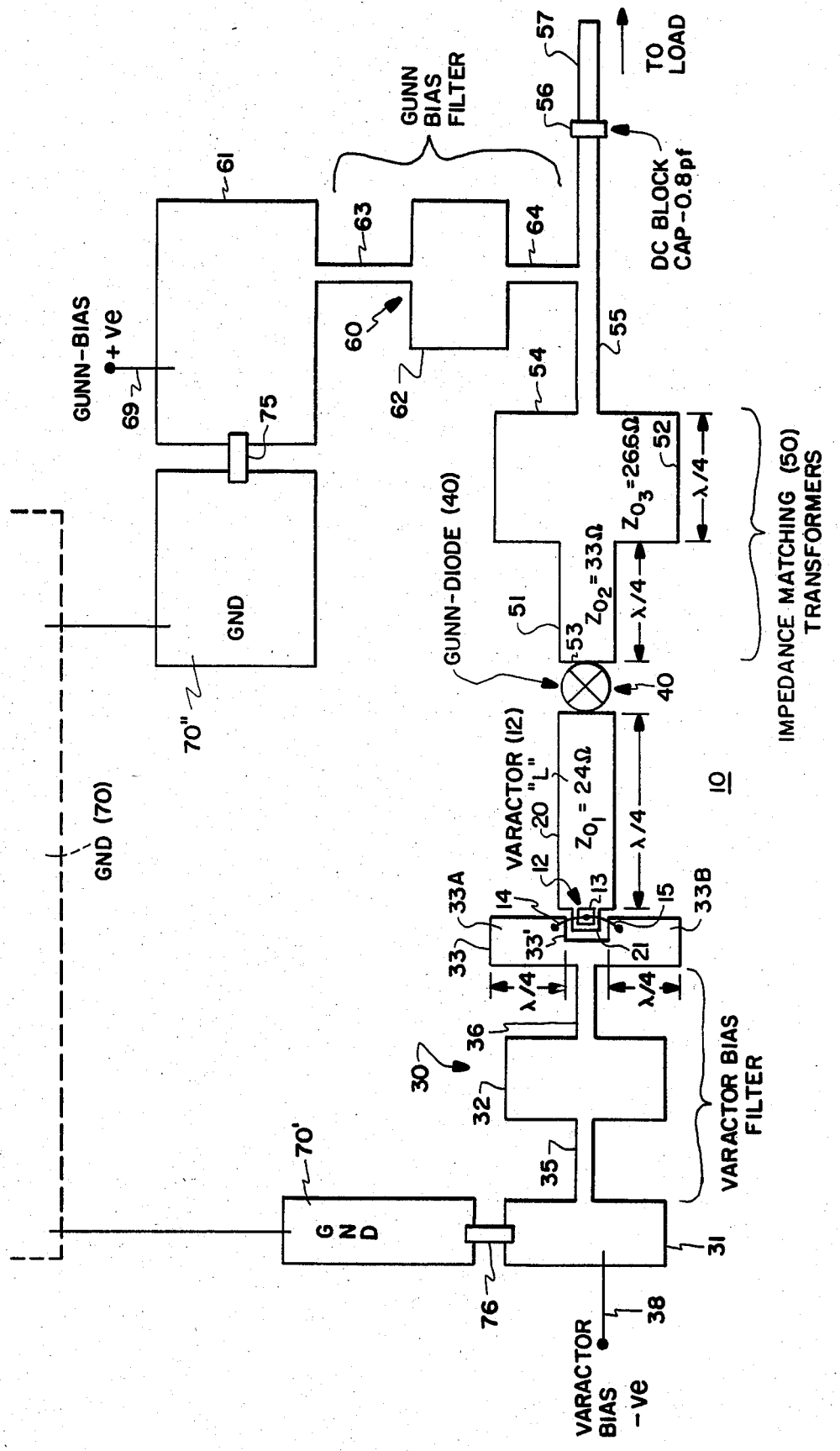

VARACTOR TUNED MICROSTRIP OSCILLATOR FOR KA BAND OPERATION

SUMMARY OF INVENTION

The Government of The United States has rights in this invention pursuant to Contract No. DAAK10-80-C-0315 awarded by the Department of the Army.

The present invention provides a planar varactor tuned microstrip oscillator for Ka band operation comprising a gallium arsenide (GaAs) Gunn-diode and a varactor diode having respective bias connections. A first filter means is connected between a source of varactor bias potential and the varactor bias connection. An impedance inverter strip is connected between the varactor diode and the Gunn diode. An impedance matching transformer having an input and an output is connected so that the input thereof is connected to the Gunn diode. The transformer output is connected via a DC blocking capacitor to load connection means. A second filter means is connected between a source of Gunn positive bias potential and the transformer output. Finally, the invention comprises ground means and second and third capacitive means connected respectively between the sources of bias potential and the ground means. The above apparatus functions in a manner whereby the varactor tunes the Gunn diode to oscillate in the Ka band.

BRIEF DESCRIPTION OF THE DRAWING

The single drawing depicts the preferred embodiment of my invention, i.e., a planar varactor tuned microstrip oscillator for Ka band operation.

DETAILED DESCRIPTION

Referring to the drawing, the reference numeral 10 generally designates my varactor tuned microstrip oscillator for Ka band operation. As is well known by those skilled in the art, a microstrip device comprises a planar dielectric substrate, a metallic, i.e., conductive continuous ground plane on one side or face of the substrate, and a metallic, i.e., conductive, pattern on the other side of the substrate. The "pattern" can take any shape or form, e.g., strips, circles, etc.

The key elements in the apparatus of the FIGURE include a GaAs Gunn diode 40 and a varactor diode 12. Gunn diodes per se, are well known to those skilled in the art. For example, reference may be made to the text book "Microwave Devices" edited by M. J. Howes and D. V. Morgan, published by John Wiley & Sons, 1976, Chapter 2. Further, varactor diodes are also well known to those skilled in the art. For example, reference may be made to the text "Variable Impedance Devices", Chapters 1 and 3, edited by M. J. Howes and D. V. Morgan and published by John Wiley & Sons, 1978. A typical GaAs Gunn diode that may be used in my invention is Varian Associates, part number VSA-9210S5. A typical varactor which may be used is Alpha Microwaves part number CJV-20101-19. In the drawing the reference numeral 40 designates a positive terminal of a Gunn diode, the negative terminal (not shown) being screwed (or equivalent) into the conductive ground plane of the microstrip.

The varactor diode 12 comprises a base member 13 and split lead means 14 and 15 which are connected respectively to portions 33a and 33b of a virtual ground 33. A notch 33' is provided in the right side of portion 33. A three section varactor bias filter 30 is provided; it comprises a low impedance section 32 intermediate first and second high impedance sections 35 and 36. Section 36 is connected to the central portion of the virtual ground 33. Section 35 is connected to an R.F. ground 31.

An impedance inverter microstrip line 20 having an elongated rectangular shape and a length equal to a quarter wave length of the desired frequency of the Gunn diode oscillator, has a reduced size end portion 21 adapted to fit within the notch 33' without contact therewith; the opposite end of inverter 20 being connected to the Gunn diode 40. The base portion 13 of the varactor is mounted on portion 21 of the inverter 20.

To the right, of the Gunn diode 40, is an impedance matching transformer 50 comprising a first portion 51 positioned adjacent and connected to Gunn diode 40 and a second lower impedance portion 52. The end 53 of portion 51 is connected to the Gunn diode 40. The right side 54 of portion 52 of the impedance matching transformer 50 constitutes an output of the transformer and is adapted to be connected via a standard microstrip line 55, a blocking capacitor 56, to another section 57 of standard microstrip line.

A three section Gunn bias filter 60 is provided to supply a positive bias potential from 69 to the Gunn diode 40. More specifically, the Gunn bias filter comprises a low impedance segments 62 which is intermediate high impedance sections 63 and 64. Section 64 is connected to microstrip line 55. Section 63 is connected to a R.F. ground section 61 which in turn is connected to a source of Gunn bias 69.

A ground means 70 is generally depicted having a portion thereof 70' physically adjacent to R.F. ground 31 and being connected thereto to a suitable capacitor 76. Further, a ground portion 70" is physically adajcent to R.F. ground 61 and is electrically connected thereto through an appropriate capacitor 75.

In operation, the varactor diode functions as a reversed bias P-N junction diode. Its function is to act as a variable capacitor in the oscillator circuit. The effective capacity of the varactor diode varies as a function of the applied bias voltage. Thus, by controlling the negative bias applied at input 38 to the varactor bias filter 30, the capacity of the varactor 12 is controlled to thus control the frequency of oscillation of the Gunn diode 40.

The varactor bias filter 30 is configured as shown to thus provide a very high impedance to the varactor diode circuit at the oscillator operating frequency. The same comment is applicable to the Gunn bias filter 60 which connects the positive biasing potential from bias connection 69 to the Gunn diode oscillator 40. The function of the high impedance of both filters 30 and 60 is to block the output of the oscillator from leaking to the sources of bias potential 38 and 69. In other words, the high impedance filters 30 and 60 assures a maximum power transfer from the oscillator to the output load.

The impedance inverter 20 is selected in length so that it provides the desired value of capacitance "C" for the oscillator circuit.

The impedance matching transformers 51 and 52, match the impedance of the Gunn diode 40 to the load.

While I have described a preferred embodiment of the invention, it will be understood that the invention is limited only by the scope of the following claims.

I claim:

1. A planar varactor tuned microstrip oscillator for Ka band operation comprising:
   (a) a GaAs Gunn diode having a terminal,
   (b) a varactor having an output and a bias connection,
   (c) a source of varactor negative bias potential;
   (d) a first filter means connected between said source of varactor bias potential and said varactor bias connection,
   (e) an impedance inverter microstrip connected between said varactor and said Gunn diode terminal,
   (f) a source of Gunn positive bias potential,
   (g) an impedance matching transformer having an input and an output,
   (h) means connecting said transformer input to said Gunn diode terminal, said transformer output being connected via a DC blocking capacitor to load connection means,
   (i) a second filter means connected between said transformer output and said source of Gunn positive bias potential,
   (j) ground means, and
   (k) second and third capacitive means connected respectively between said sources of bias potential and said ground means, whereby said varactor tunes said Gunn diode to oscillate in the Ka band.

2. Apparatus of claim 1 further characterized by said transformer having an input impedance selected to match the output impedance of said Gunn diode.

3. Apparatus of claim 2 further characterized by said transformer having an output impedance selected to match the impedance of that desired for said load connection means.

* * * * *